United States Patent
Daubenspeck et al.

(10) Patent No.: US 7,485,564 B2
(45) Date of Patent: Feb. 3, 2009

(54) UNDERCUT-FREE BLM PROCESS FOR PB-FREE AND PB-REDUCED C4

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/673,618

(22) Filed: Feb. 12, 2007

(65) Prior Publication Data

US 2008/0194095 A1     Aug. 14, 2008

(51) Int. Cl.
    *H01L 21/44*  (2006.01)
(52) U.S. Cl. .............................. 438/613; 257/E21.508; 438/614; 438/615
(58) Field of Classification Search ......... 438/613–615; 257/E21.508
    See application file for complete search history.

(56) References Cited

U.S. PATENT DOCUMENTS

| | | | |
|---|---|---|---|
| 6,117,299 A * | 9/2000 | Rinne et al. .................. | 205/125 |
| 6,293,457 B1 * | 9/2001 | Srivastava et al. ........... | 228/254 |
| 6,333,559 B1 | 12/2001 | Costrini et al. | |
| 6,853,076 B2 * | 2/2005 | Datta et al. .................. | 257/738 |
| 6,977,435 B2 | 12/2005 | Kim et al. | |
| 7,112,522 B1 * | 9/2006 | Tsao et al. ................... | 438/612 |
| 2005/0048772 A1 * | 3/2005 | Pan .............................. | 438/672 |
| 2006/0016861 A1 | 1/2006 | Daubenspeck et al. | |
| 2006/0076677 A1 * | 4/2006 | Daubenspeck et al. ...... | 257/734 |
| 2006/0175691 A1 * | 8/2006 | Dangelmaier et al. ....... | 257/677 |
| 2007/0026537 A1 * | 2/2007 | Jiang et al. ..................... | 438/3 |
| 2007/0111502 A1 * | 5/2007 | Daubenspeck et al. ...... | 438/613 |

\* cited by examiner

*Primary Examiner*—Asok K Sarkar
(74) *Attorney, Agent, or Firm*—Scully, Scott, Murphy & Presser, P.C.

(57) ABSTRACT

A system and method for eliminating undercut when forming a C4 solder bump for BLM (Ball Limiting Metallurgy) and improving the C4 pitch. In the process, a barrier layer metal stack is deposited above a metal pad layer. A top layer of the barrier layer metals (e.g., Cu) is patterned by CMP with a bottom conductive layer of the barrier metal stack removed by etching. The diffusion barrier and C4 solder bump may be formed by electroless plating, in one embodiment, using a maskless technique, or by an electroplating techniques using a patterned mask. This allows the pitch of the C4 solder bumps to be reduced.

20 Claims, 6 Drawing Sheets

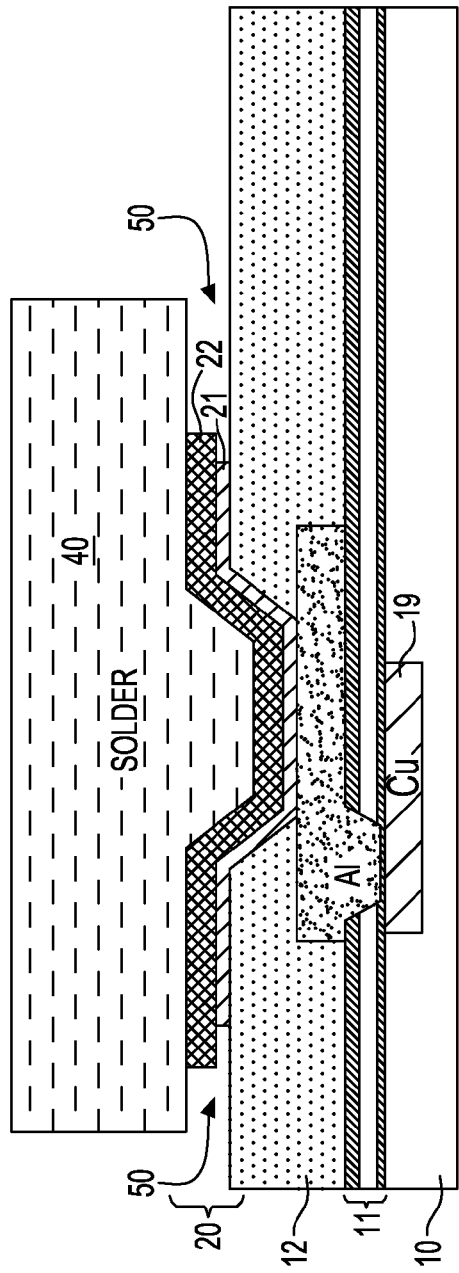
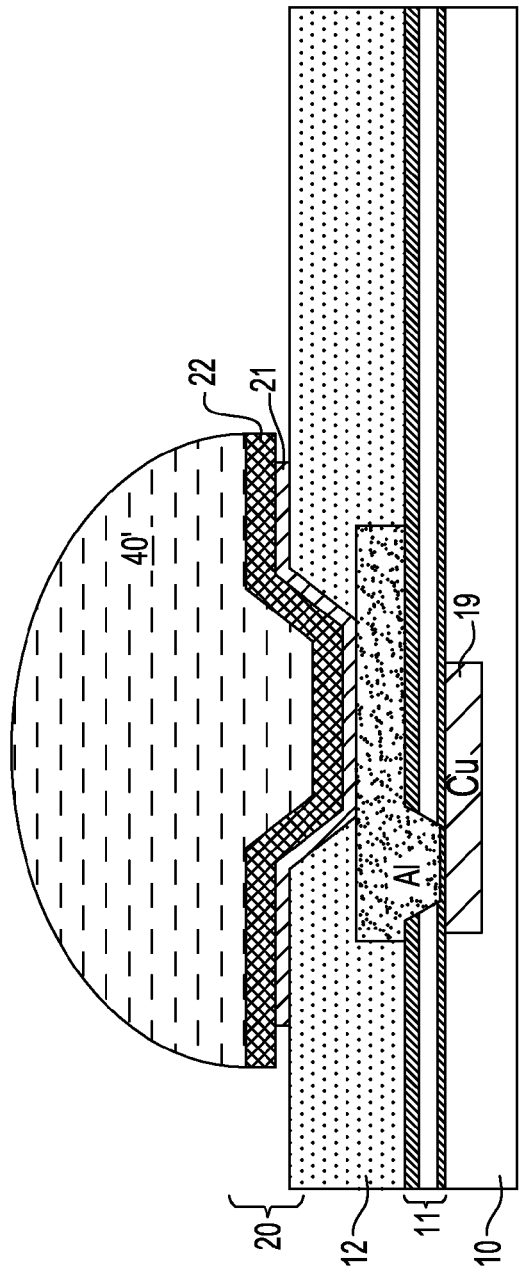
FIG. 1C (PRIOR ART)
FIG. 1D (PRIOR ART)

UNDERCUT-FREE BLM PROCESS FOR PB-FREE AND PB-REDUCED C4

BACKGROUND OF THE INVENTION

1. Field of the Invention

The present invention relates generally to the fabrication of semiconductor chips, and more particularly to a structure and novel methodology for fabricating a reliable, dimensionally accurate, high-integrity Ball Limiting Metallurgy (BLM) without undercut in Back-End-Of-Line (BEOL) semiconductor chip processing.

2. Description of the Prior Art

Controlled Collapse Chip Connection (C4) processes are well known in forming solder bumps in back-end-of line semiconductor fabrication, e.g., when chips are connected to their packaging. Typically, the formation of a C4 solder bump includes the conventional formation of a metallurgical system that includes the underlying final metal layer (pad), an under "bump" or Ball Limiting Metallurgy (BLM) and the solder ball. The BLM ideally should provide good adhesion to a wafer passivation and to the IC final metal pad, and, function as an effective solder diffusion barrier.

The drive to Lead-reduced and lead-free C4 processing together with reduced-pitch requirements limit the extendibility of current electroetch BLM technology, which routinely produces a final structure in which the baselayer BLM films (Ti, Cu) are dimensionally inset or "undercut" with respect to the outer dimension of the C4 solder ball. A typical process BLM structure for leaded C4 is comprised of an approximate ~0.15 μm TiW base layer which underlies a film of CrCu of similar thickness over which resides a copper layer that is approximately ~0.45 μm thick. A resist solder mask is used to electroplate the C4, and following a resist strip operation, the Cu/CrCu/TiW BLM is typically wet-etched using an electroetch process, with the C4 solder ball serving as the etch mask. This BLM technology can be used successfully with Pb-reduced (97/3 Pb/Sn) solder and C4 pitch that is no less than 4 on 8 mil (about 100 μm×200 μm). However, in current 65 nm technology, there is a requirement for C4 designs that are laid out on 3 on 6 mil pitch and which use both Pb-Reduced and Pb-Free C4 technology. The simple reduction in pitch from 4on8 to 3on6 minimizes contact area of the BLM to the final passivation film around the via such that undercut of the baselayer BLM films is no longer acceptable. The final via is set at ~47 μm by electrical considerations, and there is a reliability constraint that the BLM must never be reduced in dimension sufficiently to expose the via sidewall. With an electroetch undercut that is typically 10-15 μm per edge, this constraint can no longer be met with 3on6 pitch. FIG. 1 illustrates the current BLM process and the wet etch undercut problem.

Particularly, FIGS. 1A-1D depict the BLM process steps according to the prior art.

As shown in FIG. 1A, there is depicted an underlying insulating layer 10, e.g., a fluorine-doped silicon oxide layer (FSG layer) having the final copper metallization layer 19 formed therein. Formed on top of the FSG layer 10 is the further insulator stack 11 comprising, for example, SiN, $SiO_2$ and SiN layers. Formed thereabove and contacting the underlying Cu metallization 19 by a contact via is a metal bonding pad, e.g., Aluminum, and final passivation layer 12, e.g., polyimide. In FIG. 1A, there is depicted the process step of etching a final via 15 in the polyimide passivation layer 12. Then, as shown in FIG. 1B, current fabrication techniques implement Pb-free C4's using plating of the solder in a photoresist pattern, followed by wet etching of the BLM 20. In the prior art solder bump plating process, the BLM 20 includes the deposition of an adhesion layer 21, e.g., a titanium-tungsten alloy (TiW), followed by wetting layers 22 of, e.g., Cr—Cu (chromium-copper alloy) and copper (Cu). The wetting layers ensure the solder completely covers the patterned Ti—W adhesion layer (thereby ensuring a large contact area between the solder ball and the chip, and providing high mechanical strength. In the solder bump plating process, the wafer is cleaned to remove oxides or organic residue prior to metal deposition and to roughen the wafer passivation and bond pad surface to promote better adhesion of the BLM. The BLM barrier layer metals such as TiW, Cr—Cu, and Cu may then be sequentially sputtered or evaporated over the entire wafer so that the BLM 20 adheres to the wafer and passivation in addition to the bond pads. Next, a photoresist layer 30 is applied and then metal layers 40 (e.g., a Ni barrier layer followed by a C4 Sn-based solder) are electroplated over the bond pad to a height as determined by the patterned photoresist 30.

Then, as shown in FIG. 1C, after the solder bump is formed, the photoresist is stripped, leaving the BLM exposed on the wafer. The BLM 20 is subsequently etched from the wafer whereby the CrCu layer 22 is removed by electroetching, and the TiW layer 21 removed by using a wet etch process (e.g., an $H_2O_2$-based wet etch). FIG. 1C depicts the undercut 50 of approximately 10 μm-15 μm that results at each edge of the BLM due to the applied electroetch. Finally, as shown in FIG. 1D, the solder bump 40 is reflowed to form the Pb-free or Pb-reduced solder ball 40'.

For Pb-free and Pb-reduced technology, the BLM itself must normally include a top barrier layer to prevent consumption of the copper in the BLM layer by tin in the solder. Nickel is commonly used for this, in a thickness of 1-3 um. Pb-Free BLM technology is still being developed in the industry, but one Pb-Free BLM that is available comprises a stack of TiW—Cu—Ni, with the TiW layer about 0.15 μm in thickness, Cu layer from about 0.5 μm-2.0 μm in thickness, and the Ni layer about 1 μm in thickness. The TiW and Cu films are typically deposited by PVD, and the Ni is normally electroplated.

It is the case though, that problems associated with undercut of the BLM during wet electroetching of the Cu and TiW base layers exist. For example, the final structure such as shown in FIG. 1D, is at risk for reliability failure due to the minimal effective contact attach area of the remaining TiW base layer to the final passivation (polyimide) film 12, and/or with respect to the voids created by undercut 50 at each edge of the structure, which can act to entrap contaminants that act as stress nucleation sites for failure during thermal cycling.

While a partial prior solution to this problem that might include wet etch of the copper by electroetch, followed by TiW RIE to pattern the TiW base layer without undercut beneath the Cu layer is theoretically possible, in practice it does not work because of incomplete cleaning of the electroetched Cu layer in the field areas over the TiW film. The electroetch process invariably leaves minute residues which act to micromask the TiW film during the RIE, resulting in metallic residues between C4s that are of sufficient density to cause electrical shorting. This problem has proven to be unavoidable when Cu electroetch or wet-etching is used for BLM patterning.

It would be highly desirable to provide a C4 fabrication technique that results in an improved C4 pitch by eliminating the BLM undercut by a novel fabrication process that consequently increases the mechanical stability of the formed solder bump.

SUMMARY OF THE INVENTION

The present invention is directed to a novel technique for providing a reliable, dimensionally accurate, high-integrity ball limiting metallurgy (BLM) without undercut.

More particularly, the present invention is directed to a novel ball limiting metallurgy (BLM) process for improving mechanical stability of the formed solder bump in 65 nm semiconductor fabrication technology having a C4 packaging pitch of 3on6 mil, and that is also applicable to other advanced technologies with C4 interconnect pitches that may extend below 3on6 in the future.

Novel to the present invention is the elimination of the electroetch and wet etch BLM processing in favor of CMP (chem-mechanical polishing) and TiW RIE.

It is thus an object of the present invention to provide an improved method of forming a solder bump connection at a metallic bonding pad surface of a semiconductor chip. Particularly, a system and method is presented for eliminating undercut when forming a C4 solder bump for BLM (Ball Limiting Metallurgy) and improving the C4 pitch. In the process, a barrier layer metal stack is deposited above a metal pad layer. A top layer of the barrier layer metals (e.g., Cu) is patterned by CMP with a bottom conductive layer of the barrier metal stack removed by RIE etching. The diffusion barrier and C4 solder bump may be formed by electroless plating, in one embodiment, using a maskless technique, or by an electroplating techniques using a patterned mask. This allows the pitch of the C4 solder bumps to be reduced.

Thus, according to a first embodiment of the invention, the method includes steps of:

forming a passivation layer upon a metal bonding pad surface;

forming an opening in the passivation layer that exposes the metallic bonding pad surface to define a location for a solder bump connection;

forming a barrier material liner upon the patterned passivation layer, the barrier material liner conforming to a surface of the patterned passivation layer in the opening and on a passivation layer surface;

filling the barrier material lined opening with a conductive material layer and forming a layer of the conductive material atop the formed barrier material liner above the passivation layer surface;

removing a portion of the conductive material layer and barrier material liner above the passivation surface to form a conductive material plug having a surface that is substantially coplanar with a surface of a final passivation layer, the barrier material liner being eliminated above the passivation layer surface;

forming a diffusion barrier layer patterned atop the substantially coplanar surface of the conductive material plug;

providing solder material upon a surface of the diffusion barrier layer; and processing the solder material to form the solder bump connection atop the diffusion barrier layer while avoiding a masking step, the method enabling a chip having reduced pitch and increased mechanical stability of the solder bump connection.

According to a second embodiment of the invention, the method includes steps of:

forming a passivation layer upon a metal bonding pad surface;

forming an opening in the passivation layer that exposes the metallic bonding pad surface to define a location for a solder bump connection;

forming a barrier material liner upon the patterned passivation layer, the barrier material liner conforming to a surface of the patterned passivation layer in the opening and on a passivation layer surface;

forming a conductive material layer over the barrier material liner to fill the opening, the conductive material layer extending atop the formed barrier material liner above the passivation layer surface;

removing a portion of the conductive material layer and a portion of the barrier material liner above the passivation surface to form a conductive material plug having a surface that is substantially coplanar with a surface of a remaining portion of the barrier material liner;

forming a patterned resist material layer upon the substantially coplanar surface, the patterned resist material layer including an opening at the defined solder bump connection location;

forming a diffusion barrier layer upon the substantially coplanar surface defined by the patterned resist material layer opening;

providing solder material upon a surface of the diffusion barrier layer and between patterned walls defining the patterned resist material layer opening;

removing the patterned resist material layer and removing the remaining portion of the barrier material stack under the patterned resist layer; and, processing the solder material to form the solder bump connection, wherein said barrier material liner adjacent said solder bump connection exhibit decreased amount of undercut to enable reduced pitch and increased mechanical stability of said solder bump connection.

Advantageously, the present invention is useful with C4NP solder transfer technology as well, allowing for use of the "strategic" TiW/Cu/Ni BLM for that application.

BRIEF DESCRIPTION OF THE DRAWINGS

Further features, aspects and advantages of the structures and methods of the present invention will become better understood with regard to the following description, appended claims, and accompanying drawings where:

FIGS. 1A-1D illustrate, through cross-sectional views, C4 BLM processing technique in accordance with the prior art;

DETAILED DESCRIPTION OF THE PREFERRED EMBODIMENTS

The process flow for forming a novel solder bump metallurgy according to the invention is now described with reference to FIGS. 2A-2C.

The process flow allows for the reliable fabrication of a BLM for Pb-Free and Pb-Reduced C4, without undercut. The process can be used with the TiW—Cu—Ni BLM and will solve the undercut problems. Alternatively, the disclosed process can also be used for a standard Pb-reduced BLM containing CrCu—e.g. TiW/CrCu/Cu/Ni. The process depends upon the replacement of electroetch of the Cu (and CrCu) and TiW layer with first a damascene CMP to create a localized Cu "plug" (or CrCu/Cu) only in the final via, and then a RIE process for TiW. The RIE process for TiW is successful because of the now complete removal of Cu (or CrCu) residues (normally present after wet or electroetching) in the field areas by CMP. The TiW—Cu layers are deposited by PVD, and the plug is formed by damascene CMP of Cu, stopping on the TiW. There are two embodiments from this process point forward. In the first, direct advantage is taken of the relatively lower resistance in the via metallization to selectively plate Ni and solder only there. This embodiment would have the added advantage with respect to today's process of record, of eliminating the C4 photo-masking step. In the second embodiment, the C4 resist masking layer would be formed in the normal manner, after the damascene Cu CMP step. The Ni would then be electroplated into the via area, followed by the C4 solder. The resist mask would be stripped, and RIE of the TiW process would proceed using the C4 solder ball as the RIE mask. Though it would not eliminate a masking step, this embodiment enables fabrication of a useful and reliable structure, not possible today for this BLM with 3 on 6 mil technology, using (process of record) electroetching.

Figure 1A:
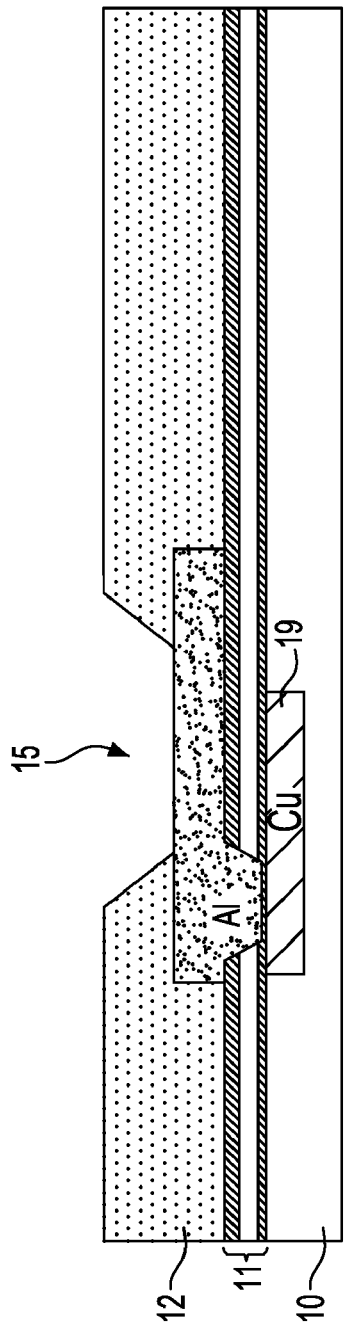
Figure 1B:
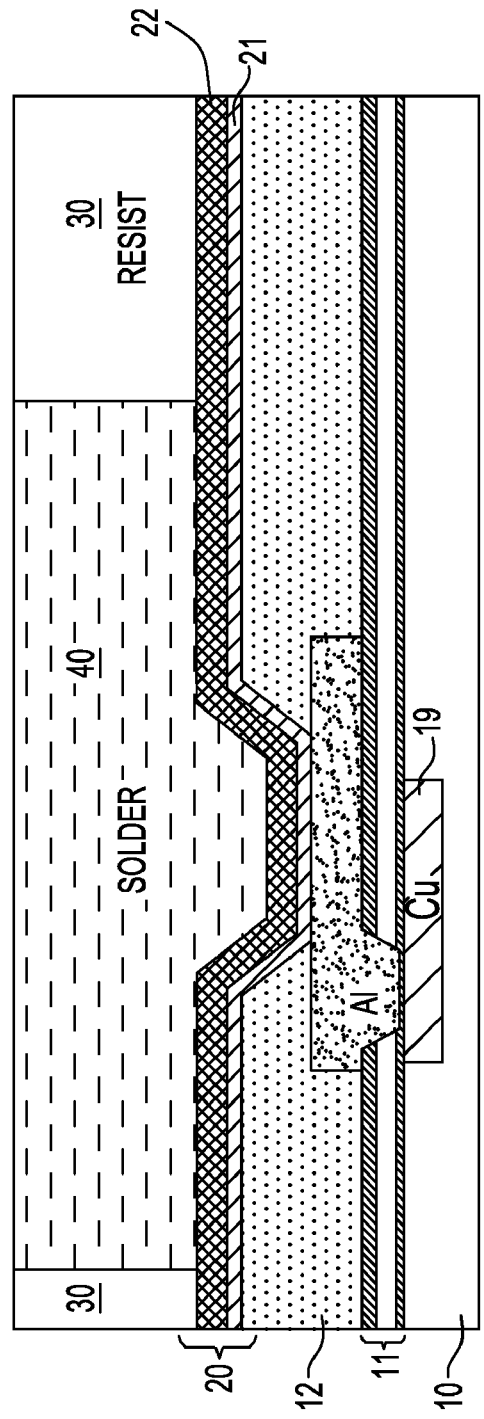
Figure 2A:
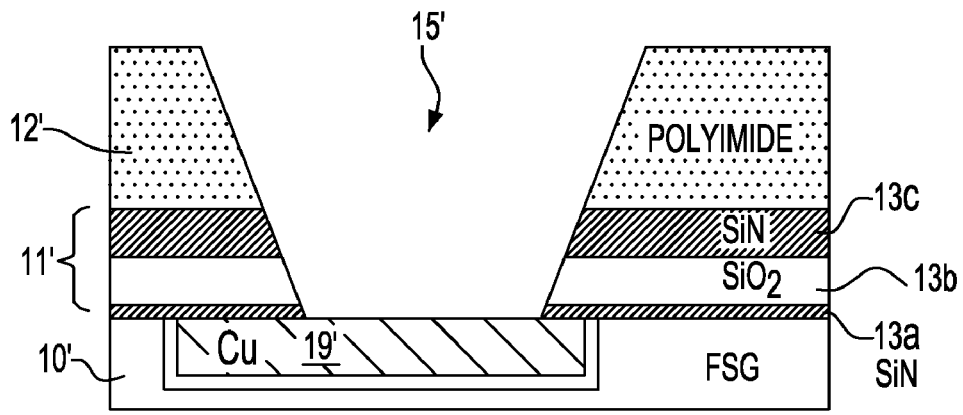
FIGS. 2A-2C depict, through cross-sectional views, the novel BLM processing technique in accordance with a first embodiment of the present invention.

The invention is a process for fabricating a reliable, dimensionally accurate, high-integrity BLM without undercut, that proceeds as now described with view of FIG. 2A. The first steps include the normal BEOL processing of record through the final passivation (e.g., a polyimide sector) upon the chip surface that includes a last conducting metal layer 19', e.g., a metallic bonding pad layer comprising Cu, Al, or other conducting metal layer, including any required diffusion barrier layer, in a low-k interconnect dielectric material layer, e.g., an oxide such as FSG (i.e., fluoro-silicate glass or like fluorinated silicon oxide,) an organic dielectric, such as SiLK, or a hybrid dielectric such as SiCOH, Black Diamond® or any other low K BEOL dielectric material. This passivation layer 10' is deposited using conventional deposition techniques, such as plasma-enhanced chemical vapor deposition (PECVD). Formed on top of the FSG layer 10' is a further insulator stack 11' comprising one or more passivation material layers. In one example embodiment depicted in FIG. 2A, the passivation layer includes the stack 11' comprising deposited passivation material layers including a lower layer 13a such as SiN, an intermediate layer 13b such as $SiO_2$ and an upper passivation layer 13c including SiN formed using conventional processing. It is understood that this stack may comprise other dielectric layers, including other oxides, nitrides, or oxynitrides. Formed above insulator stack 11' is a final passivation layer 12', e.g., polyimide or other organic or inorganic material layer. The structure shown in FIG. 2A includes a terminal via 15' resulting after conducting an etch process for forming a tapered trench defining placement of the solder bump and BLM. For example, as shown in FIG. 2A, a single via opening 15' is etched at a location directly above the surface of the metallic bonding pad layer comprising Cu 19' defining the location for the solder bump terminal.

Figure 2B:
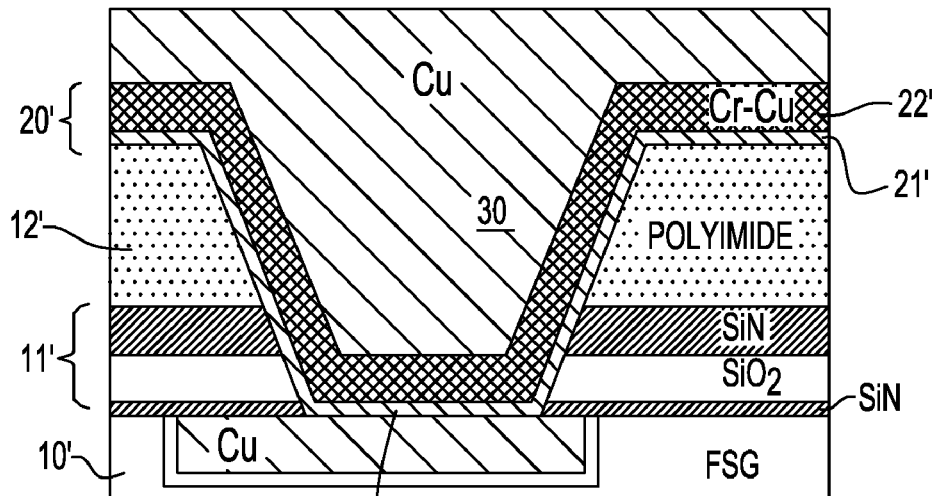

Continuing, as shown in FIG. 2B, a further process step includes depositing underbump metallurgy (UBM) which, according to the embodiments described herein, comprise a stack of barrier layer metals 20' that conform to the shape of the underlying passivation layer 12'. In one embodiment depicted in FIG. 2B, the barrier layer metals 20' comprises a stack of deposited material layers including a bottom layer 21' of Ti—W (Titanium-Tungsten diffusion barrier), and a top thin layer of Cu (not shown) or, alternately, a top thin layer 22' of a Cr—Cu (chromium copper) wetting layer. These barrier layer metals 20' may all be deposited utilizing physical vapor deposition techniques (PVD). In one embodiment, the TiW layer 21' ranges between about 0.15 µm to 0.3 µm in thickness, and the layer 22' of Copper material (or CrCu/Cu material for 97/3 or Pb-reduced) is deposited to a thickness ranging between about 0.5 µm-1.0 µm. As a result of this step, a conductive material 30, e.g., Copper, fills the final via hole as shown in FIG. 2B. It is understood however, that in alternate embodiments, the barrier metal layer may comprise other materials in a variety of stack configurations. Other metal layers that can be used for the under bump metallurgy include Ta, TaN, W, Ti, Al, Ni, Ni alloys, and Au. Some other BLM stacks (in addition to TiW/CrCu/Cu) include TiW/Cu, Ti/Cu, Ti/Ni—V/Cu, Al/Ni—V/Cu, any/all of which would make use of a barrier top-layer Ni, Ni—Si, or other suitable Cu barrier material. It is further understood that other deposition techniques may be utilized to form the barrier metal layer stack including CVD, electroless plating, and electroplating. Moreover, it is understood that an optional sacrificial material layer (not shown), e.g., Ta, may be deposited to a thickness ranging between about 10 nm to 200 nm, with a preferred thickness of about 50 nm, for example, on top of the barrier layer metal stack 20' to function as a polish stop thereby preventing dishing of Cu during a subsequent chemical-mechanical polish (CMP) step.

Figure 2C:
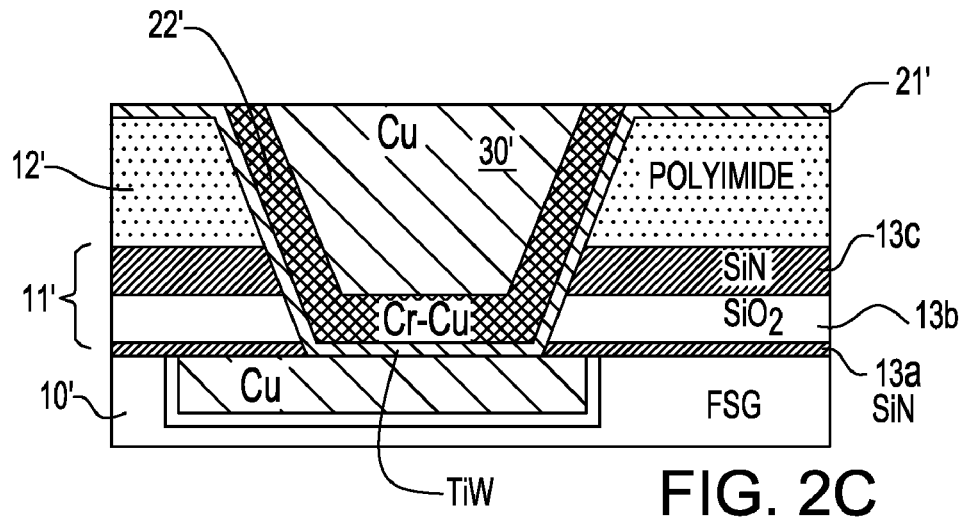

In the next process step, shown in FIG. 2C, the top Cu metal layer 30 (and/or CrCu/Cu layers) is polished (and any optional sacrificial layer is polished) stopping on the TiW layer 21' to leave the structure where the top metal layer (e.g., Cu) is substantially coplanar with the TiW layer 21' and forms a substantially flat horizontal surface. This is accomplished utilizing well known CMP (chemical mechanical polishing) steps. Preferably, the CMP process is formed with enough over-polish to ensure residue cleanup in field areas. As a result of this step, a "plug" 30' of Cu is left in the final via hole.

Figure 3A:
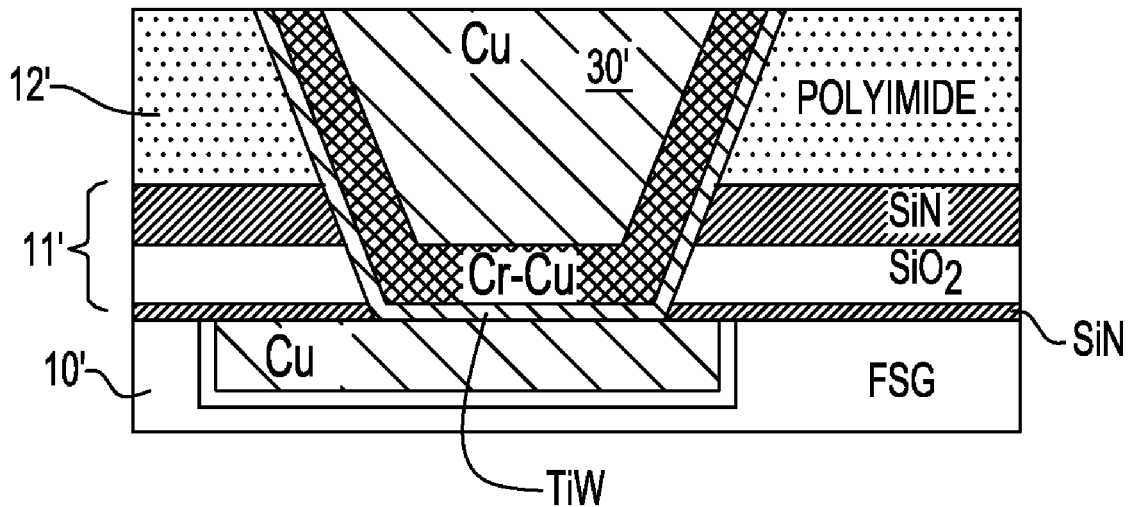
FIGS. 3A-3B depict, through cross-sectional views, additional processing steps according to a first embodiment of the invention.
Figure 3B:
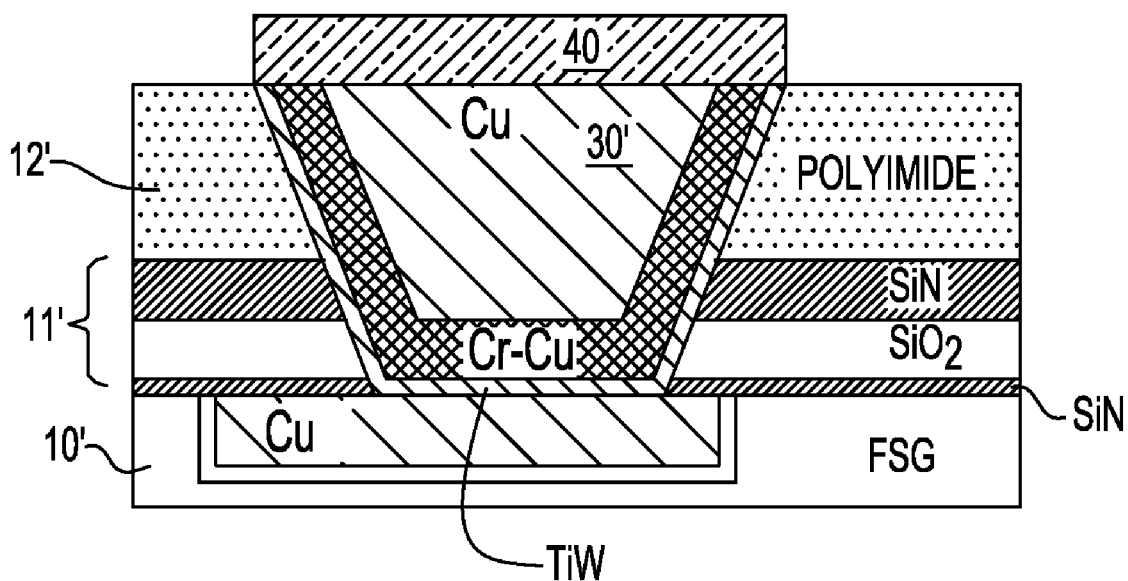

Then, in a next process step shown in FIG. 3A, the co-planar surface portion of the BLM Ti—W layer 21' is etched utilizing a Reactive ion Etch (RIE) process; and, a layer 40 of conductive metal, e.g., a Nickel (Ni) layer 40, is formed atop the surface of the resulting structure of FIG. 3B, extending across the top of the Copper plug 30' and those portions of the BLM TiW and/or CrCu/Cu layers 20' present at the surface, as shown in FIG. 3B. In an example embodiment, the Ni layer 40 may be formed by a deposition technique such as electroless plating to a thickness ranging between about 1 µm-2 µm, however, different thicknesses may be implemented. It is understood that the electroplating occurs selectively where resistance Rs is lowest, i.e., in the via holes but not in field areas.

Figure 4:
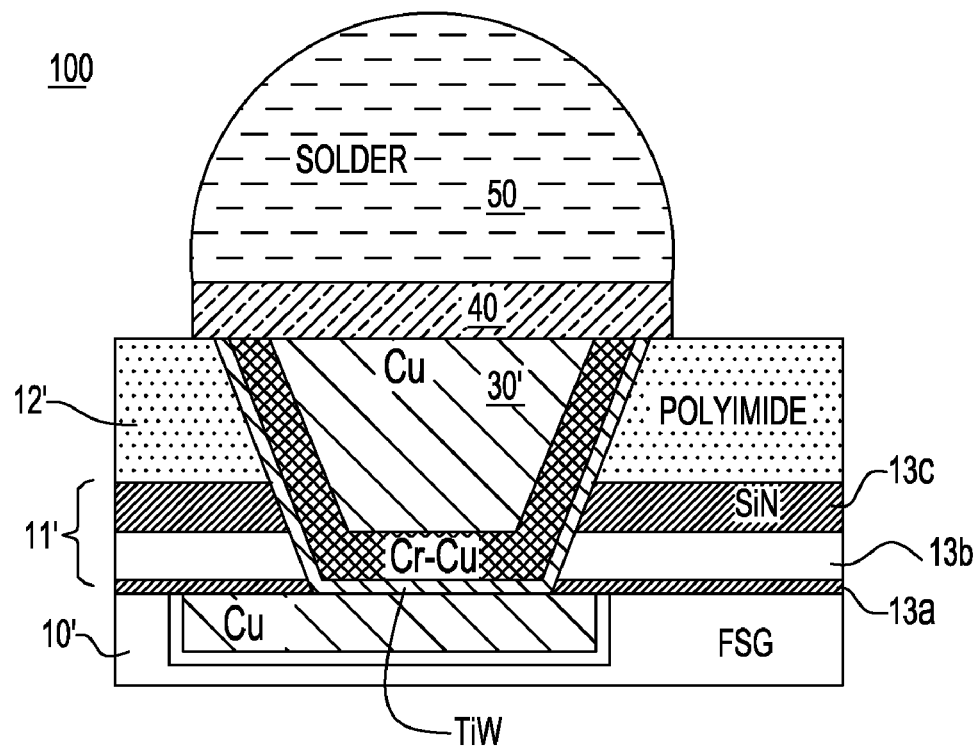
FIG. 4 illustrates, through a cross-sectional view, the resulting structure including the C4-type connection absent any BLM undercut in accordance with the invention.

Finally, in the resulting structure 100 of the first embodiment depicted in FIG. 4, the C4 solder bump (e.g., Pb/Sn) of hemispherical shape is formed on top of the Ni layer 40 by an anneal (solder reflow) process. Thus it is clear from this first embodiment, that direct advantage is taken of the relatively lower resistance in the via metallization 30' to selectively plate Ni and solder only at that Ni structure. This embodiment has the added advantage with respect to today's process of record of eliminating the C4 photo-masking step, i.e., this embodiment advantageously eliminates a masking step.

Figure 5A:
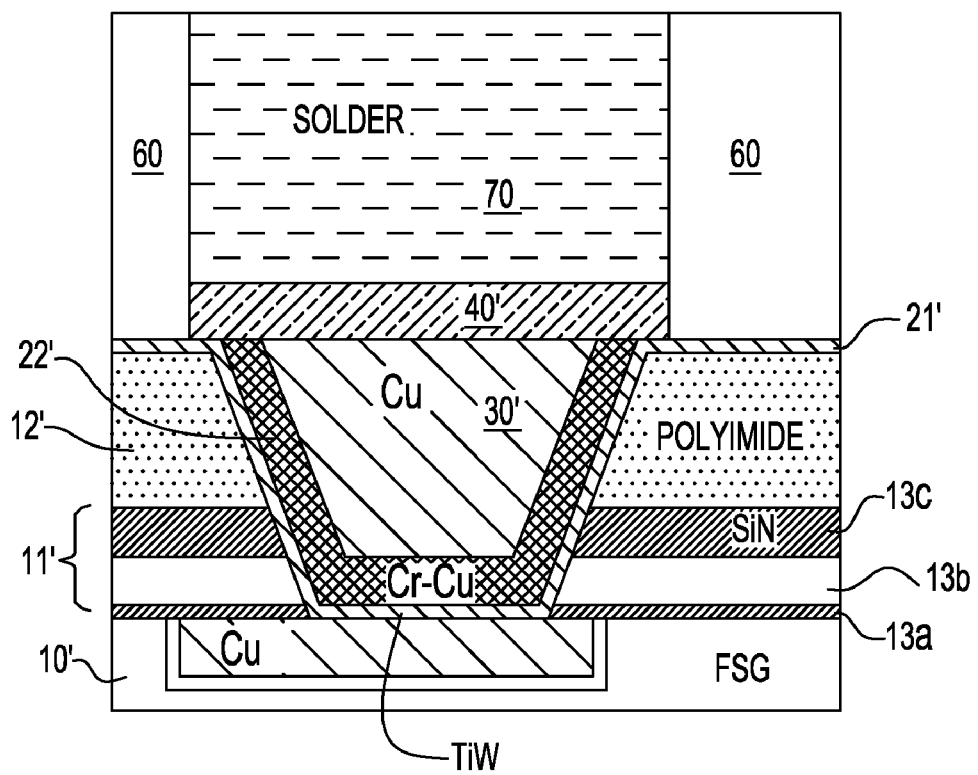
FIGS. 5A-5B depict, through cross-sectional views, additional processing steps according to a second embodiment of the invention; and, FIG. 5C illustrates, through a cross-sectional view, the resulting structure including the C4-type connection absent any BLM undercut in accordance with the invention.

In an alternate embodiment, depicted in FIG. 5A, after the top Cu metal layer 30 and/or CrCu/Cu layers have been polished as described herein with respect to FIG. 2C, a photolithographic technique is performed including the deposition of a resist 60 patterned to include an opening that defines the subsequent formation of the solder bump at the solder bump terminal. As shown in FIG. 5A, the patterned resist 60 is formed on top of the remaining Ti—W layer 21' of the BLM structure shown in FIG. 2C. The deposited resist 60, which may be a typical positive or negative photoresist, is etched to open up and expose the underlying Cu plug 30' and any exposed portions of the BLM, e.g., the Ti—W barrier layer 21' and the CrCu layer 22'. Further, as shown in FIG. 5A, a metal material layer 40', e.g., Nickel, is deposited at the exposed opening over the coplanar surface defined at the opening between walls of the patterned resist 60 by electroplating. This diffusion barrier layer 40' may include a nickel (Ni) material or alloy, such as Ni—V or Ni—P, that is deposited over the flat coplanar surface at the solder bump terminal to a thickness ranging from about 0.5 μm-5 μm, however, different thicknesses may be implemented, e.g., about 1 μm-2 μm. Further depicted in FIG. 5A is the formation of solder bump material 70 (e.g., Pb/Sn) within the walls of the patterned resist layer 60 at the solder bump terminal. Preferably, the solder material 70 is deposited using a well-known electroplating technique.

Figure 5B:
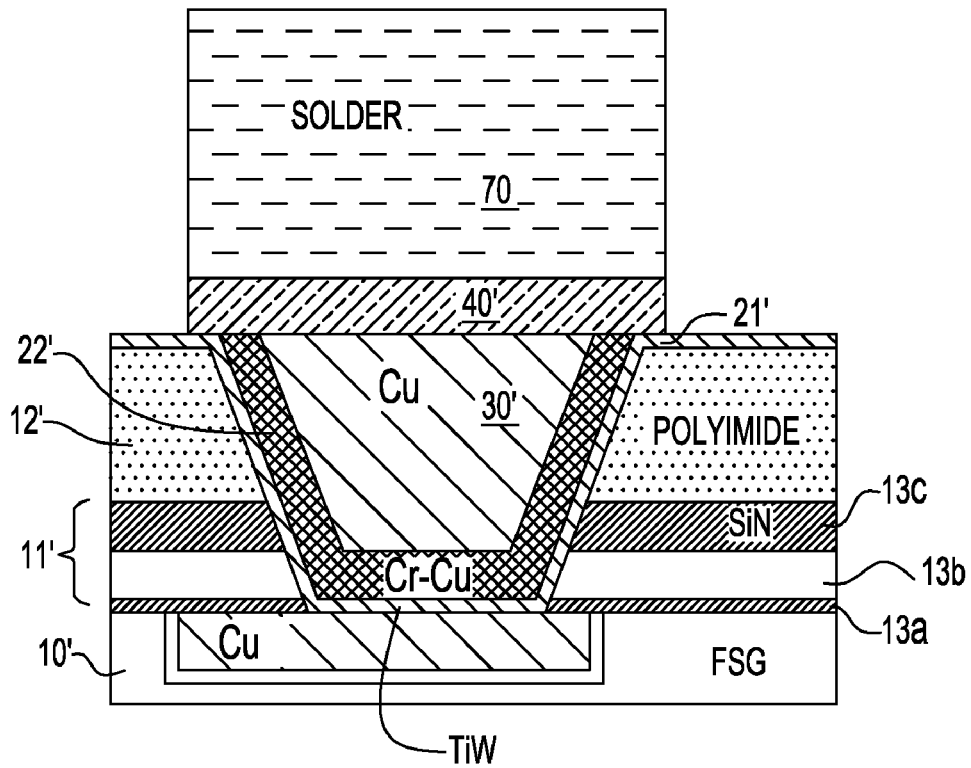
Figure 5C:
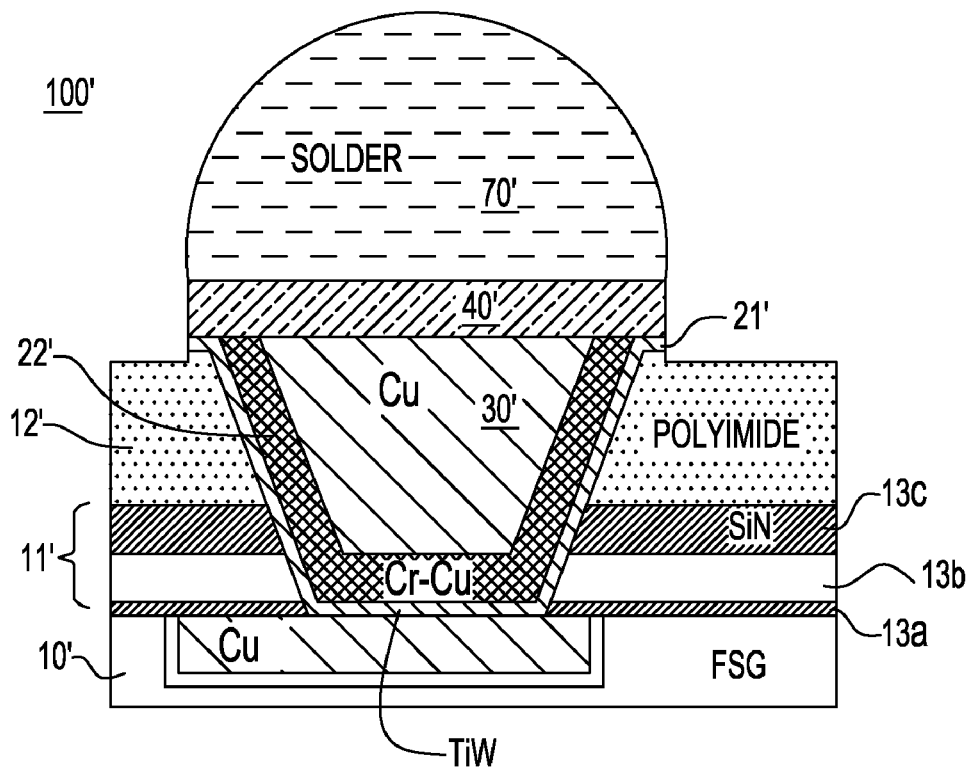

Next, as shown in FIG. 5B, the patterned resist material layer 60 is removed, e.g., stripped by $O_2$ Ash or other suitable strip chemistry, followed by a rinse. Then, an RIE (e.g., wet etch) process is implemented to remove the CrCu 22' and TiW 21' barrier metal layers adjacent, the solder bump terminal. Particularly, using the C4 solder ball 70 as mask in FIG. 5B, the remaining TiW layer portion are cleanly removed in field areas, leaving it beneath solder w/ anisotropic edge (no undercut). Finally, the solder material 60 is reflowed to form a solder ball 70' of hemispherical shape for the resulting electrode connector 100' such as shown in FIG. 5C.

The alternate methodologies described herein with respect to FIGS. 2A-5C enables the pitch of the C4 solder bumps to be reduced. In the second embodiment, the C4 resist masking layer is formed in the normal manner, e.g., after the damascene Cu CMP step. The Ni would then be electroplated into the formed via area, followed by the C4 solder. The resist mask is stripped, and RIE of the TiW process proceeds using the C4 solder ball as the RIE mask. Thus, although the masking step is not eliminated, this embodiment would enable fabrication of a useful and reliable structure, not possible today for this BLM with 3on6 technology, using (process of record) electroetching.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method of forming a contact electrode for a semiconductor chip, said method comprising the steps of:
   forming a passivation layer upon a metal bonding pad surface;
   forming a tapered opening in said passivation layer that exposes said metallic bonding pad surface to define a location for a solder bump connection, wherein at least a portion of a tapered sidewall of said passivation layer around said tapered opening overlies said metal bonding pad surface;
   forming a barrier material liner directly upon said tapered sidewall of said patterned passivation layer and said metal bonding pad surface, said barrier material liner conforming to a surface of said patterned passivation layer including said tapered sidewall;
   filling said barrier material lined tapered opening with a conductive material layer and forming a layer of said conductive material atop said formed barrier material liner above said passivation layer surface;
   removing by polishing a portion of said conductive material layer and barrier material liner above said passivation surface to form a conductive material plug having a surface that is substantially coplanar with a surface of a final passivation layer and filling said tapered opening, wherein said polishing stops on a portion of said barrier material liner;
   forming a diffusion barrier layer patterned atop said substantially coplanar surface of said conductive material plug;
   providing solder material upon a surface of said diffusion barrier layer; and
   processing the solder material to form said solder bump connection atop said diffusion barrier layer while avoiding a masking step, said method enabling a chip having reduced pitch and increased mechanical stability of said solder bump connection.

2. The method of forming a contact electrode as claimed in claim 1, wherein said step of forming a diffusion barrier layer comprises implementing an electroless plating technique.

3. The method of forming a contact electrode as claimed in claim 2, wherein said barrier material liner comprises a barrier material stack having one or more conductive material layers, said step of removing said portion of said conductive material layer and barrier material liner comprising: implementing a chemical-mechanical-polishing (CMP) step, wherein a top layer of said conductive material layers of said barrier material liner stack is removed by said CMP.

4. The method of forming a contact electrode as claimed in claim 3, wherein said implemented CMP step for removing said top layer of said conductive material layers includes stopping on a surface of said remaining conductive material layer of said barrier material stack.

5. The method of forming a contact electrode as claimed in claim 4, further comprising removing said remaining portion of said conductive material layers of said a barrier material stack adjacent said solder bump connection location by RIE etching.

6. The method of forming a contact electrode as claimed in claim 3, wherein said top layer of said conductive material layers of said barrier material stack comprises Cr, Cu or alloys thereof.

7. The method of forming a contact electrode as claimed in claim 6, wherein said remaining portion of said conductive material layers of said barrier material stack comprises Ti, W or alloys thereof 8. The method of forming a contact electrode as claimed in claim 1, wherein said diffusion barrier layer comprises Ni.

9. The method of forming a contact electrode as claimed in claim 1, wherein said step of providing solder material includes implementing an electroless plating technique for depositing said solder material.

10. The method of forming a solder bump connection as claimed in claim 1, wherein said step of forming a passivation layer upon said metallic bonding pad surface includes forming a single via opening to expose said metallic bonding pad surface.

11. A method of forming a solder bump connection at a metallic bonding pad surface of a semiconductor chip, said method comprising the steps of:

forming a passivation layer upon a metal bonding pad surface;

forming a tapered opening in said passivation layer that exposes said metallic bonding pad surface to define a location for a solder bump connection, wherein at least a portion of a tapered sidewall of said passivation layer around said tapered opening overlies said metal bonding pad surface;

forming a barrier material liner directly upon said tapered sidewall of said patterned passivation layer and said metal bonding pad surface, said barrier material liner conforming to a surface of said patterned passivation layer including said tapered sidewall;

forming a conductive material layer over said barrier material liner to fill said tapered opening, said conductive material layer extending atop said formed barrier material liner above said passivation layer surface;

removing by polishing a portion of said conductive material layer and a portion of said barrier material liner above said passivation surface to form a conductive material plug having a surface that is substantially coplanar with a surface of a remaining portion of said barrier material liner and filling said tapered opening, wherein said polishing stops on a portion of said barrier material liner;

forming a patterned resist material layer upon said substantially coplanar surface, said patterned resist material layer including an opening at said defined solder bump connection location;

forming a diffusion barrier layer upon said substantially coplanar surface defined by said patterned resist material layer opening;

providing solder material upon a surface of said diffusion barrier layer and between patterned walls defining said patterned resist material layer opening;

removing the patterned resist material layer and removing said remaining portion of said barrier material stack under said patterned resist layer; and, processing the solder material to form said solder bump connection, wherein said barrier material liner adjacent said solder bump connection exhibit decreased amount of undercut to enable reduced pitch and increased mechanical stability of said solder bump connection.

12. The method of forming a solder bump connection as claimed in claim 11, wherein said step of removing said remaining portion of said barrier material stack under said patterned resist layer includes performing an etching process.

13. The method of forming a solder bump connection as claimed in claim 12, wherein said etching process utilizes said solder material as an etch mask.

14. The method of forming a solder bump connection as claimed in claim 12, wherein said etching step includes removing a remaining portion of said conductive material layers of said barrier material stack adjacent said solder bump connection location by RIE etching.

15. The method of forming a solder bump connection as claimed in claim 11, wherein said step of forming a diffusion barrier layer comprises implementing an electroplating technique.

16. The method of forming a solder bump connection as claimed in claim 15, wherein said barrier material liner comprises a barrier material stack having one or more conductive material layers, said step of removing said portion of said conductive material layer and said barrier material liner comprises: implementing a chemical-mechanical-polishing (CMP) step, wherein a top layer of said conductive material layers of said barrier material liner stack is removed by said CMP stopping on a surface of a remaining portion of said barrier material stack.

17. The method of forming a solder bump connection as claimed in claim 16, wherein a top layer of said conductive material layers of said barrier material stack comprises Cr, Cu or alloys thereof.

18. The method of forming a solder bump connection as claimed in claim 16, wherein said remaining portion of said conductive material layers of said barrier material stack comprises Ti, W or alloys thereof.

19. The method of forming a solder bump connection as claimed in claim 11, wherein said diffusion barrier layer comprises Ni.

20. The method of forming a solder bump connection as claimed in claim 11, wherein said step of providing solder material includes implementing an electroplating technique for depositing said solder material.

* * * * *